United States Patent [19]

Doan et al.

[11] Patent Number: 5,395,801
[45] Date of Patent: Mar. 7, 1995

[54] CHEMICAL-MECHANICAL POLISHING PROCESSES OF PLANARIZING INSULATING LAYERS

[75] Inventors: Trung T. Doan; Scott Meikle, both of Boise, Id.

[73] Assignee: Micron Semiconductor, Inc., Boise, Id.

[21] Appl. No.: 130,117

[22] Filed: Sep. 29, 1993

[51] Int. Cl.⁶ .................... H01L 21/302; H01L 21/463
[52] U.S. Cl. .................................. 437/225; 437/228; 437/195; 156/636
[58] Field of Search ................. 437/228, 225, 195; 156/636

[56] References Cited

U.S. PATENT DOCUMENTS

| | | | |
|---|---|---|---|
| 4,735,679 | 4/1988 | Lasky | 156/636 |
| 4,910,155 | 3/1990 | Cote et al. | 437/8 |
| 4,944,836 | 7/1990 | Beyer et al. | 156/645 |
| 4,956,313 | 9/1990 | Cote et al. | 437/203 |
| 4,957,881 | 9/1990 | Crotti | 437/197 |
| 4,992,135 | 2/1991 | Doan | 156/636 |
| 5,006,482 | 4/1991 | Kerbaugh et al. | 437/67 |
| 5,064,683 | 11/1991 | Poon et al. | 427/39 |
| 5,077,234 | 12/1991 | Scoopo et al. | 437/67 |
| 5,084,419 | 1/1992 | Sakao | 437/228 |
| 5,124,780 | 6/1992 | Sandhu et al. | 357/67 |
| 5,272,117 | 12/1993 | Roth et al. | 437/228 |

*Primary Examiner*—Olik Chaudhuri
*Assistant Examiner*—H. Jey Tsai
*Attorney, Agent, or Firm*—Well, St. John, Roberts, Gregory & Matkin

[57] ABSTRACT

A semiconductor processing method of providing and planarizing an insulating layer on a semiconductor wafer includes the following sequential steps: a) providing a conformal layer of insulating material to a first thickness over a semiconductor wafer having non-planar topography; b) providing a CMP polishing protective layer over the conformal layer to a second thickness, the protective layer being of different composition than the conformal layer; and c) chemical-mechanical polishing the protective layer and conformal layer in a single CMP step using a single CMP slurry and under conditions which in combination with the slurry remove the conformal layer material at a faster rate than the protective layer material, the protective layer upon outward exposure of conformal layer material in high topographical areas restricting material removal from low topographical areas during such chemical-mechanical polishing. Alternately, the protective layer and conformal layer are CMPed in at least two steps using first and second respective CMP slurries. The first CMP step and slurry remove outermost portions of the protective layer in a manner which is substantially selective to the underlying conformal layer to outwardly expose conformal layer material in high topographical areas. The second CMP step and slurry remove the conformal layer material at a faster rate than the protective layer material. The protective layer upon outward exposure of conformal layer material in high topographical areas restricts material removal from low topographical areas during such second CMP step.

36 Claims, 6 Drawing Sheets

CHEMICAL-MECHANICAL POLISHING PROCESSES OF PLANARIZING INSULATING LAYERS

TECHNICAL FIELD

This invention relates specifically to planarizing of insulating layers on semiconductor wafers using chemical-mechanical polishing.

BACKGROUND OF THE INVENTION

Integrated circuits are chemically and physically integrated into a substrate, such as a silicon or gallium arsenide wafer, by patterning regions in the substrate, and by patterning layers on the substrate. These regions and layers can be electrically conductive, or formed to be semi-electrically conductive and of different conductivity types. Such regions are utilized to form electronic components or devices, such as transistors, diodes and capacitors. Thousands of these devices are formed essentially simultaneously on the surface of a single wafer of semiconductor material during processing.

Initially, each of the electronic devices are electrically isolated from others. But later in the fabrication sequence, specific devices are electrically interconnected so as to implement the desired circuit function. Throughout the evolution of integrated circuits, the aim of component device scaling has essentially been twofold: (1) to increase circuit performance (mainly by increasing circuit speed), and (2) to increase the functional complexity of the circuits. At the outset, scaling down of active device sizes was a very effective means of achieving each of these goals. Eventually, the scaling of active devices became less profitable, as the limitations of the circuit speed and maximum functional density came to depend more on the characteristics of the electrical interconnects of the devices rather than on the scale of the devices themselves. In addition, the aspects of silicon utilization, chip costs, and ease of flexibility of integrated circuit design were also adversely affected by electrical interconnect-technology restrictions. The approaches to lifting these limitations have predominantly involved the implementation of vertical stacking or integration of devices and their associated electrical interconnection, commonly referred to as multilevel-interconnect schemes.

One drawback of multilevel interconnection is a loss of topological planarity. Loss of planarity results in associated problems in photolithography and etch, as well as other problems. To alleviate these problems, the wafer is "planarized" at various points in the process to minimize non-planar topography and its adverse effects. As additional levels are added to multilevel-interconnection schemes and circuit features are scaled to sub-micron dimensions, the required degree of planarization increases. Such planarization can be implemented in either the conductor or the dielectric layers. This invention is specific to planarizing techniques associated with the dielectric insulating materials.

One method used to provide wafer surface planarity in a dielectric layer includes forming an oxide layer such as borophosphosilicate glass (BPSG) on a wafer surface, then heating the wafer to reflow and planarize the oxide layer. Such a technique is commonly referred to as "reflow", and was an effective means of planarizing with comparatively large device geometries. However, as technology allowed for smaller device feature sizes, reflow methods produced unsatisfactory degrees of planarization.

Another method used to produce a planar wafer surface is to initially spin coat the wafer with photoresist. The spin coating of this material on the wafer surface fills the low points and produces a planar upper surface from which to start. Next, a dry etch which removes photoresist and oxide at a rate sufficiently close to 1:1, removes the photoresist and the high points of the wafer, thereby producing a substantially planarized oxide layer on the wafer surface.

Most recently, chemical-mechanical polishing (CMP) processes have been used to planarize the surface of wafer in preparation for device fabrication. The CMP process involves holding a thin, flat wafer of semiconductor material against a rotating wetted polishing pad surface under controlled downward pressure. A polishing slurry, such as a mixture of either a basic or an acidic solution, is used as a chemical etch component in combination with alumina or silica particles. A rotating polishing head or wafer carrier is typically used to hold the wafer under controlled pressure against a rotating polishing platen. The polishing platen is typically covered with a polishing pad material, such as blown polyurethane. Such polishing employs both chemical and mechanical aspects of removal. In one aspect, the liquid portion of the slurry chemically removes, loosens or modifies the composition of the material on the wafer which is desired to be removed. The particles or grit within the slurry, in combination with the rotating polishing pad, then physically remove the chemically modified material from the wafer.

The effectiveness of chemical-mechanical polishing for planarization is in part dependent upon its ability to remove high areas faster than low areas, something which is commonly referred to as CMP "selectivity". Such is typically defined as the ratio of the high area removal rate to the low area removal rate. It is preferred to have CMP selectivity as high as possible to reduce doming, and allow thinner oxide deposition over the topography.

CMP selectivity is a function of pad compressibility, slurry, process pressure, platen speed, differential height, and the distance of measured low and high points, and pattern density, as is well perceived by people of skill in the CMP art. In conventional planarization processes, including those of CMP, an undesirably thick oxide layer is deposited before chemical-mechanical polishing to enable full planarization of the topography. The minimum pre-CMP oxide thickness is generally determined by:

$$\text{Oxide} = X0 + X1 + S(t) \cdot T \qquad (1)$$

where:
 $X0$ = highest underlayer step
 $X1$ = remain BPSG thickness over highest step
 $S(t)$ = low area removal rate (function of time)
 $H(t)$ = high area removal rate (function of time)
 $T$ = polishing time in minutes = $X0/H(t) + t'$
 $t'$ = over CMP time to account for film/CMP uniformity.

It can be seen from Equation (1) that it is desirable to have a small low area removal rate, $S(t)$, to minimize the oxide thickness required for full planarization.

The term $S(t) \cdot T$ can be rewritten in terms of selectivity as follows:

$$T = X0/H(t) + t'$$

$$S(t)*T = S(t)*(X0/H(t) + t')$$

$$= (S(t)/H(t))*X0 + S(t)*t'$$

$$S(t)*T - S(t)*t' = S(t)/H(t)*X0$$

$$S(t)*(T - t') = S(t)/H(t)*X0$$

Since $$sel = H(t)/S(t)$$

$$S(t) = (1/sel)*X0/(T - t')$$

Since the low area removal rate, S(t), is inversely proportional to the selectivity, as selectivity is improved the net removal from the low areas is reduced.

Alternately considered, present CMP technology essentially requires that the net removed thickness over the highestmost projection be greater than 1.5 times the greatest topographical distance in order to achieve adequate planarization. Such is described with reference to FIGS. 1 and 2. There illustrated is a semiconductor wafer fragment indicated generally by reference numeral 10. Wafer fragment 10 is comprised of a bulk substrate 12 and an electrically conductive metal or polysilicon runner 14. A conformal layer 16 of insulating material is provided to a first thickness over substrate 12, which has a non-planar topography the result of runner 14. Such results in the illustrated projecting portion 18 of insulating material 16 above runner 14. Insulating material 16 would typically be $SiO_2$ which has been doped with boron and/or phosphorus. For purposes of the continuing discussion, conductive runner 14 has an upper surface 20 which comprises a highestmost projection of the non-planar topography of wafer 10. Likewise, bulk substrate surface 12 includes an uppermost surface 22 which, for purposes of the continuing discussion, provides a lowestmost surface or indentation for purposes of characterizing the non-planar wafer topography atop which layer 16 is provided. Such surfaces have a defined maximum distance therebetween designated by letter "A". Letter "B" designates the thickness of deposited BPSG layer 16. Letter "F" depicts the greatest topological distance of layer 16 (i.e., the difference between the highest and lowestmost points of layer 16) immediately prior to the CMP step depicted by FIG. 2.

In many instances do to increasing circuit density, "F" will be greater than "A". This results from less than complete 100% conformal step coverage in the deposition of layer 16. For example as the distance between adjoining runners 14 diminishes, less material will be deposited in the low points (surfaces 22) than is deposited on the high points (surfaces 20). Subsequent steps, such as reflow or other heat treatments, leave a distance "F" which can and will typically be greater than distance "A".

FIG. 2 illustrates the FIG. 1 wafer after chemical-mechanical polishing. Distance "E" depicts the post CMP thickness of layer 16 above the highest elevation surface 20, Distance "E" is a parameter which the process designer selects based upon criteria not particularly germane to this disclosure. Thickness "B" is selected to arrive at the desired distance "E". Such selection is dependent upon the present capabilities of chemical-mechanical polishing processes. Presently, thickness "B" is selected such than B-E is greater than 1.5 times F, where F is the greatest topographical distance immediately prior to the CMP step.

Such effectively results in an increase in the vertical volume of processing material on the wafer. If possible, it would be desirable to reduce the vertical quantity of interlevel dielectric material 16 while still achieving the high degree of planarity provided by chemical-mechanical polishing processes.

In order to reduce the amount of material polished, it is necessary to reduce the undesirable removal of material in the global low levels of the wafer that occurs at the same time that global high levels of the wafer are being polished. Such occurs in part because the polishing pad is not perfectly flat or rigid, but rather conforms by bending to contact low areas of the wafer as well as high areas of the wafer upon polishing. Chemical mechanical polishing pressure is of course greatest at or against the highest points. But nevertheless, polishing pressure does result in some chemical-mechanical polishing action of the global low areas of the wafer at the same time that the high areas of the wafer are being removed. It would be desirable to minimize removal of material from these lower global wafer areas, for example the scribe areas between to dies.

FIG. 3 is a three-dimensional graphical representation of a prior art chemical-mechanical polishing process. Such involved a semiconductor wafer having an average distance between highestmost projections and lowestmost indentations of 0.8 microns, thus defining a highly nonplanar topography. A layer of BPSG deposited to a thickness of 2.6 microns was provided atop the wafer, and was chemical-mechanical polished by prior art techniques to achieve global planarization. The polishing slurry comprised colloidal silica slurry, and the pad comprised a polyethylene polymer. FIG. 3 represents essentially seven snapshots in time of the degree of planarization of that BPSG layer during the chemical-mechanical polishing process towards the goal of achieving substantial wafer planarity. The illustrated mountain-looking projection at the far left represents a feature on the wafer at the start of chemical-mechanical polishing, while the relatively flatter surface at the far right of the graph represents the finished chemical-mechanical polished product. The Z axis is fixed with respect to the wafer surface. The zero plane of the Z axis represents the starting point of the globally low areas of the oxide surface prior to chemical-mechanical polishing. It would be ideal if planarization of the illustrated mountains could be achieved downwardly to the point of being flush with the illustrated zero Z plane, meaning none of the global low area is removed while the high areas are effectively flattened to the zero Z plane. Yet as indicated by the far right (seventh) data point on the graph, considerable removal below the zero Z plane has occurred to achieve desired planarization. Further, removal below the zero Z plane begins almost immediately in the prior art process, as represented by the second discrete mountain-like projection extending to or starting from beneath the zero Z plane.

It would be desirable to improve upon such techniques and provide chemical-mechanical polishing processing steps for planarizing interlevel dielectrics which minimize the required removal rate of material in the global low, scribe area below the illustrated Z axis zero plane.

BRIEF DESCRIPTION OF THE DRAWINGS

Preferred embodiments of the invention are described below with reference to the following accompanying drawings.

FIG. 3 is a graphical depiction illustrating aspects of a prior art chemical-mechanical polishing process, and is described in the "Background" section above.

FIG. 9 is a graphical depiction of an alternate chemical-mechanical polishing process conducted in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing and planarizing an insulating layer on the semiconductor wafer comprises the following sequential steps:
  providing a conformal layer of insulating material to a first thickness over a semiconductor wafer having non-planar topography;
  providing a chemical-mechanical polishing protective layer over the conformal layer to a second thickness, the protective layer being of different composition than the conformal layer; and
  chemical-mechanical polishing the protective layer and conformal layer in a single chemical-mechanical polishing step using a single chemical-mechanical polishing slurry and under conditions which in combination with the slurry remove the conformal layer of material at a faster rate than the protective layer of material, the protective layer upon outward exposure of conformal layer material in high topographical areas restricting material removal from low topographical areas during such chemical-mechanical polishing.

In accordance with another aspect of the invention, a semiconductor processing method of providing and planarizing an insulating layer on a semiconductor wafer comprises the following sequential steps:
  providing a conformal layer of insulating material to a first thickness over a semiconductor wafer having non-planar topography;
  providing a chemical-mechanical polishing protective layer over the conformal layer to a second thickness, the protective layer being of different composition than the conformal layer; and
  chemical-mechanical polishing the protective layer and conformal layer in at least two chemical-mechanical polishing steps using first and second respective chemical-mechanical polishing slurries, the first chemical-mechanical polishing step and slurry removing outermost portions of the protective layer in a manner which is substantially selective to the underlying conformal layer to outwardly expose conformal layer of material in high topographical areas, the second chemical-mechanical polishing step and slurry removing the conformal layer of material at a faster rate than the protective layer of material, the protective of layer upon outward exposure of conformal layer of material in high topographical areas restricting material removal from low topographical areas during such second chemical-mechanical polishing step.

In accordance with another aspect of the invention, at least three chemical-mechanical polishing steps are conducted using two different slurries.

Figure 1:
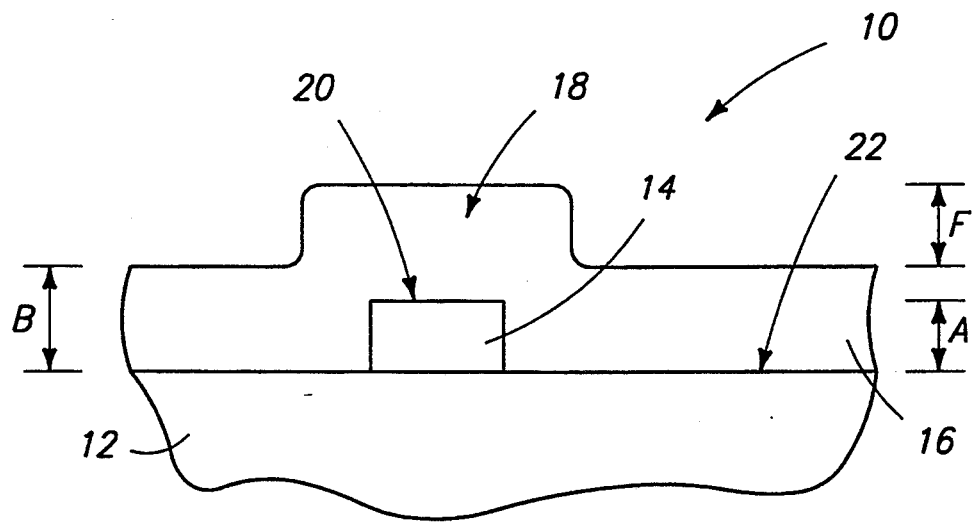
FIG. 1 is a diagrammatic section of a semiconductor wafer processed in accordance with prior art methods, and is described in the "Background" section above.
Figure 2:
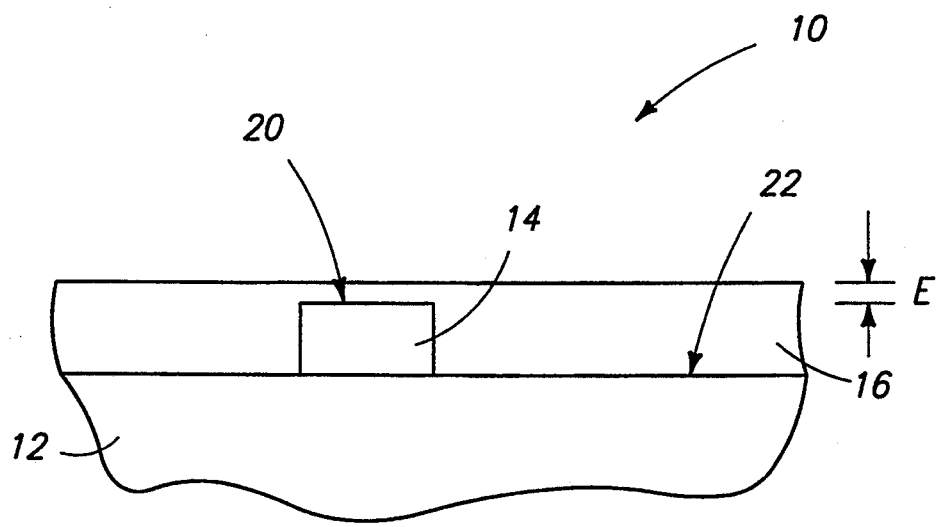
FIG. 2 is a view of the FIG. 1 wafer at a prior art processing step subsequent to that shown by FIG. 1.
Figure 2:
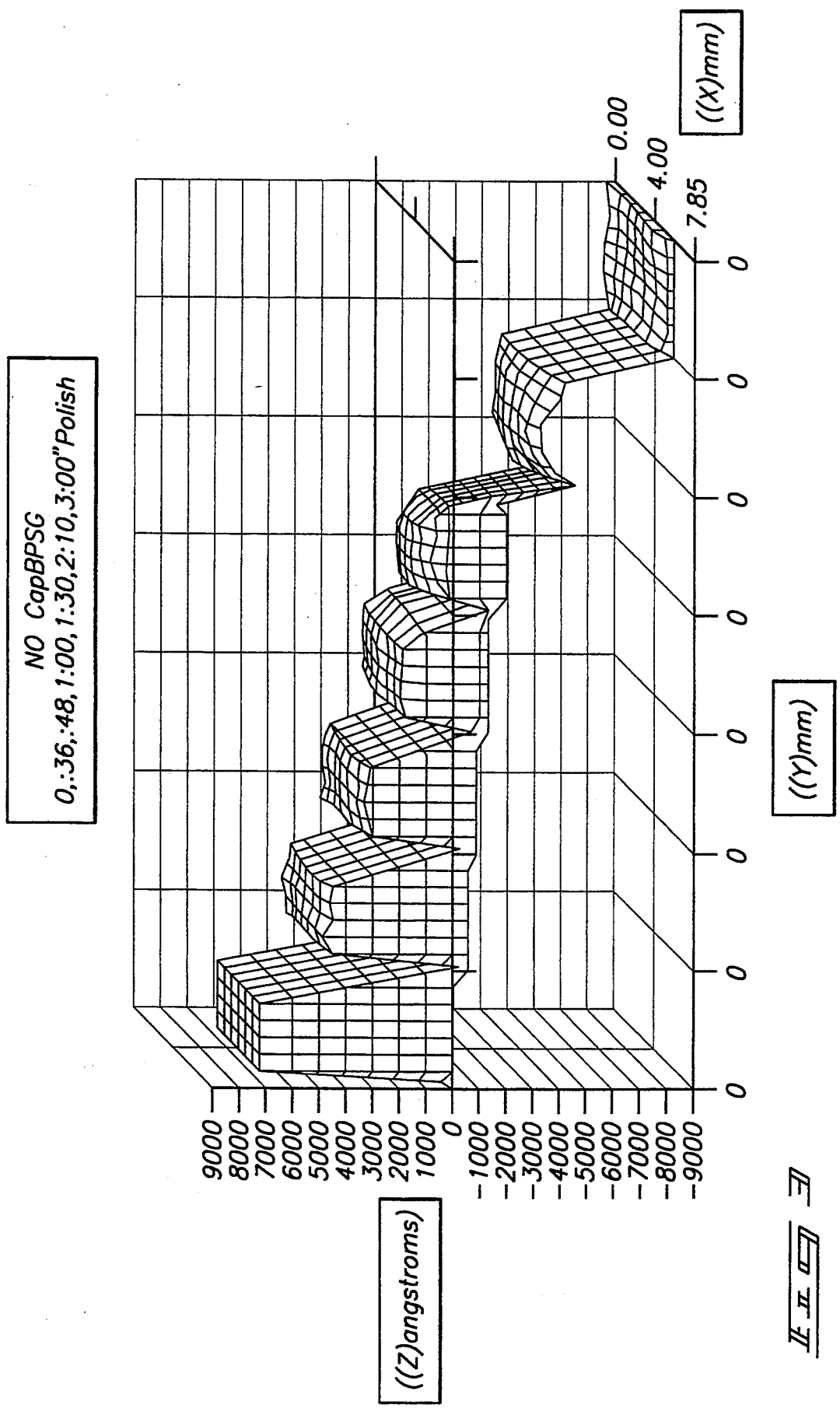
Figure 4:
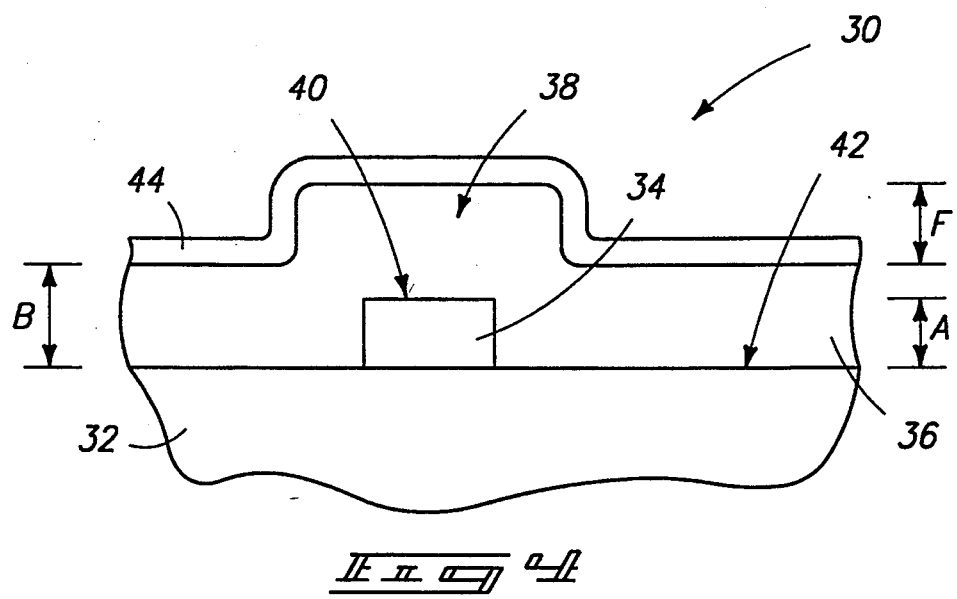
FIG. 4 is a diagrammatic section of a semiconductor wafer fragment processed in accordance with the invention.
Figure 5:
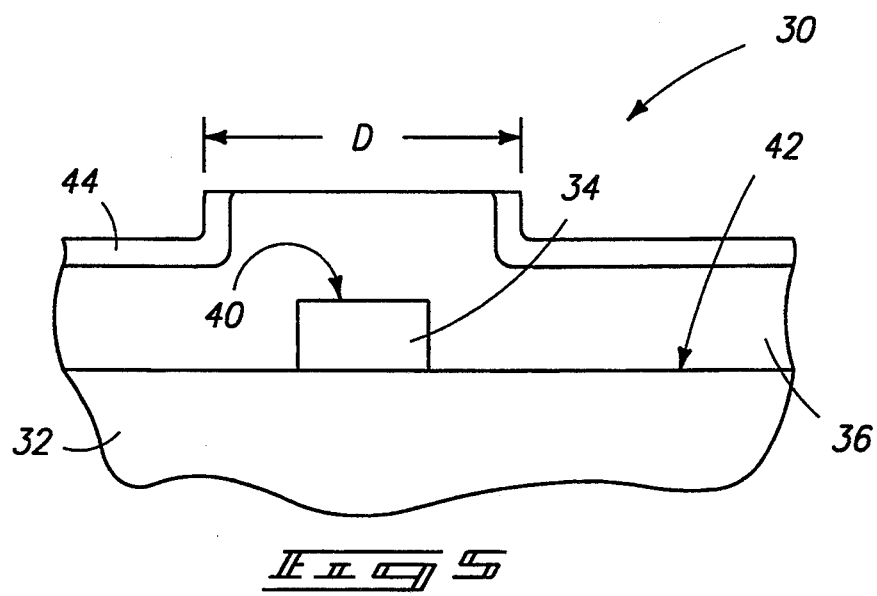
FIG. 5 is a diagrammatic representation of the FIG. 4 wafer fragment illustrated at a processing step subsequent to that shown by FIG. 4.
Figure 6:
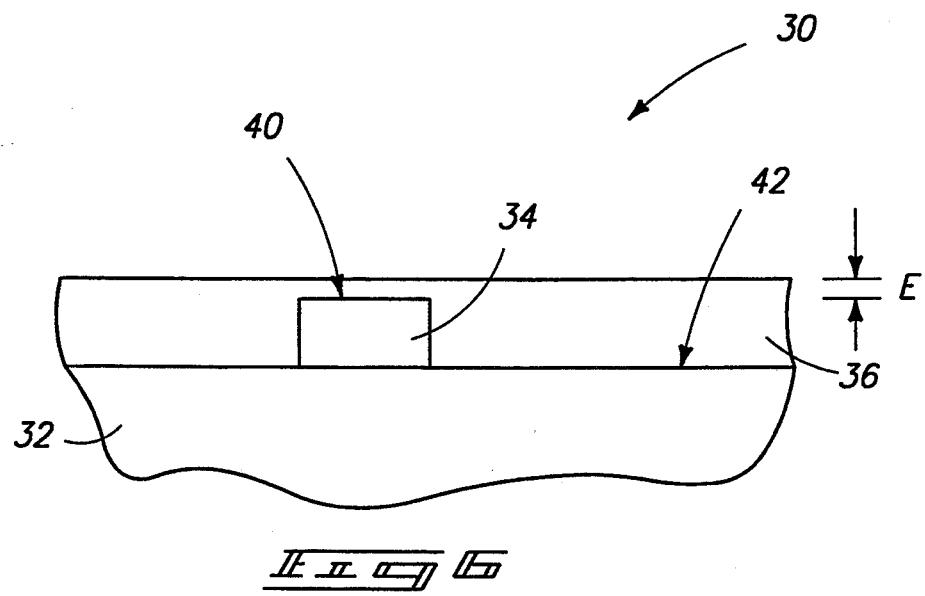
FIG. 6 is a diagrammatic view of the FIG. 4 wafer fragment illustrated at a processing step subsequent to that shown by FIG. 5.

More specifically and first with reference to FIGS. 4–6, there illustrated is a semiconductor wafer fragment indicated generally by reference numeral 30. Wafer fragment 30 is comprised of a bulk substrate 32 and an electrically conductive metal or polysilicon runner 34. A conformal layer 36 of insulating material is provided to a first thickness over substrate 32, which has a non-planar topography the result of runner 34. Such results in the illustrated projecting portion 38 of insulating material 36 above runner 34. Insulating material 36 could be any material whereby chemical-mechanical polishing steps in accordance with the invention described below can be achieved. A preferred material is $SiO_2$. Most preferred is an insulating material of $SiO_2$ which has been doped with boron and/or phosphorus. The invention was reduced to practice utilizing BPSG. For purposes of the continuing discussion, conductive runner 34 has an upper surface 40 which comprises a highestmost projection of the non-planar topography of wafer 30. Likewise, bulk substrate surface 32 includes an uppermost surface 42 which, for purposes of the continuing discussion, provides a lowestmost surface or indentation for purposes of characterizing the non-planar wafer topography atop which layer 36 is provided. Such surfaces have a defined maximum distance therebetween designated by letter "A". Letter "B" designates the thickness of deposited BPSG layer 36.

A chemical-mechanical polishing protective layer 44 is provided over conformal insulating layer 36 to a second thickness (designated with letter "C"), and is comprised of a different composition than conformal layer 36. Reasons for differing composition will become apparent from the continuing discussion. Example preferred materials for protective layer 44 where layer 36 comprises BPSG are titanium metal and tungsten metal (in either elemental or alloy form), undoped $SiO_2$ (such as produced by decomposition of tetraethylorthosilicate [TEOS]), and nitride compounds (such as $Si_3N_4$) and polysilicon. As is apparent, second thickness "C" is less than first thickness "B".

Referring to FIGS. 5 and 6, protective layer 44 and conformal layer 36 are chemical-mechanical polished in a single chemical-mechanical polishing step using a single chemical-mechanical polishing slurry and under conditions which in combination with the slurry remove conformal layer of material at a faster rate than the material of protective layer 44. Alternately considered or termed, chemical-mechanical polishing slurry and other polishing conditions are utilized which remove underlying material 36 in a manner which is largely selective to removal of overlying layer 44. An example slurry where layer 36 comprises BPSG and layer 44 comprises any of titanium, tungsten, nitride or undoped $SiO_2$ is the SC-1 chemical-mechanical polishing slurry available from the Cabot Company. Such is understood to comprise colloidal silica, KOH, glycerol and $H_2O$.

FIG. 5 illustrates initial removal of the outermost portions of protective layer 44 to the point of exposure of the outer regions of underlying BPSG layer 36. During such initial polishing, higher CMP pressure is applied at the outermost projection as compared to the lowermost portions of the wafer, such that layer 44 effectively provides a high degree of protection in the lower scribe areas. Upon outward exposure of conformal layer 36 as shown in FIG. 5, the area of outwardly exposed conformal layer material 36 in an illustrated high pressure CMP zone "D" is greater in quantity than the outwardly exposed area of protective layer material 44. Such facilitates effective equal removal of exposed conformal layer material 36 in this region "D" as compared to protective layer material 44 in this region "D", resulting in a planarizing removal. Most advantageous also is that protective layer 44 outside of this region "D" minimizes chemical-mechanical polishing of these regions.

Such polishing continues until a level is reached which is substantially co-planar with the upper surface of region 44. Chemical-mechanical polishing can then continue, if desired, to remove all of the protective layer material until the post chemical-mechanical polished insulating layer 16 has a preselected third thickness "E" over the highestmost projecting surface. As referred to in the background section, thickness "E" is typically the preselected design parameter point to which the wafer is polished. In some instances and where the protective layer material is provided to be of an insulating dielectric material, it may be desirable to effectively stop chemical-mechanical polishing to roughly coincide with reaching of the upper surface of layer 44.

In accordance with another aspect of the invention, the chemical-mechanical polishing steps illustrated by FIGS. 5 and 6 are conducted in at least two steps using first and second respective chemical-mechanical polishing slurries. The first step and slurry would be utilized in removing outermost portions of protective layer 44, such as by way of example substantially only in region "D", in a manner which is substantially selective to removal of the underlying material of conformal layer 36. Such would outwardly expose conformal layer 36 in high topographical areas, such as region "D" of FIG. 5. An example slurry which would remove either $Si_3N_4$ or undoped $SiO_2$ deposited by decomposition of TEOS would include $H_2O_2$ 30 vol %; KOH 1 vol %; $Al_2O_3$ 1 vol %; with the remainder being $H_2O$.

In the second chemical-mechanical polishing step, slurry and other polishing conditions would be utilized which remove conformal layer material 36 at a faster rate than the protective layer material 44. In the described example, the above-described Cabot SC-1 slurry provides this desired feature.

In accordance with another aspect of this invention, three chemical-mechanical polishing steps are conducted. The first two are utilized as described above with reference to the two-step, two-slurry process. Such would typically be conducted to substantially chemical-mechanical polish through layer 44 in the lower topographical areas near the desired planarity point. Thereafter, a third chemical-mechanical polishing step using the first slurry and first chemical-mechanical polishing step conditions would be utilized to remove any stubborn remaining protective layer material 44 that may not have been completely removed.

The above-described processes provide significant advantages over the prior art. For example as in the prior art, conformal layer of insulating material 36 has a greatest topographical distance "F" immediately prior to the step of chemical-mechanical polishing. With a technique of the invention, the first thickness "B" can be selected such that the first thickness minus the third thickness "E" is less than 1.5 times the greatest topographical distance "F", and even less than or equal to 1.1 times "F". Such enables reduced overall required thickness and corresponding volumetric circuit density in a finished semiconductor wafer chip.

Figure 7:
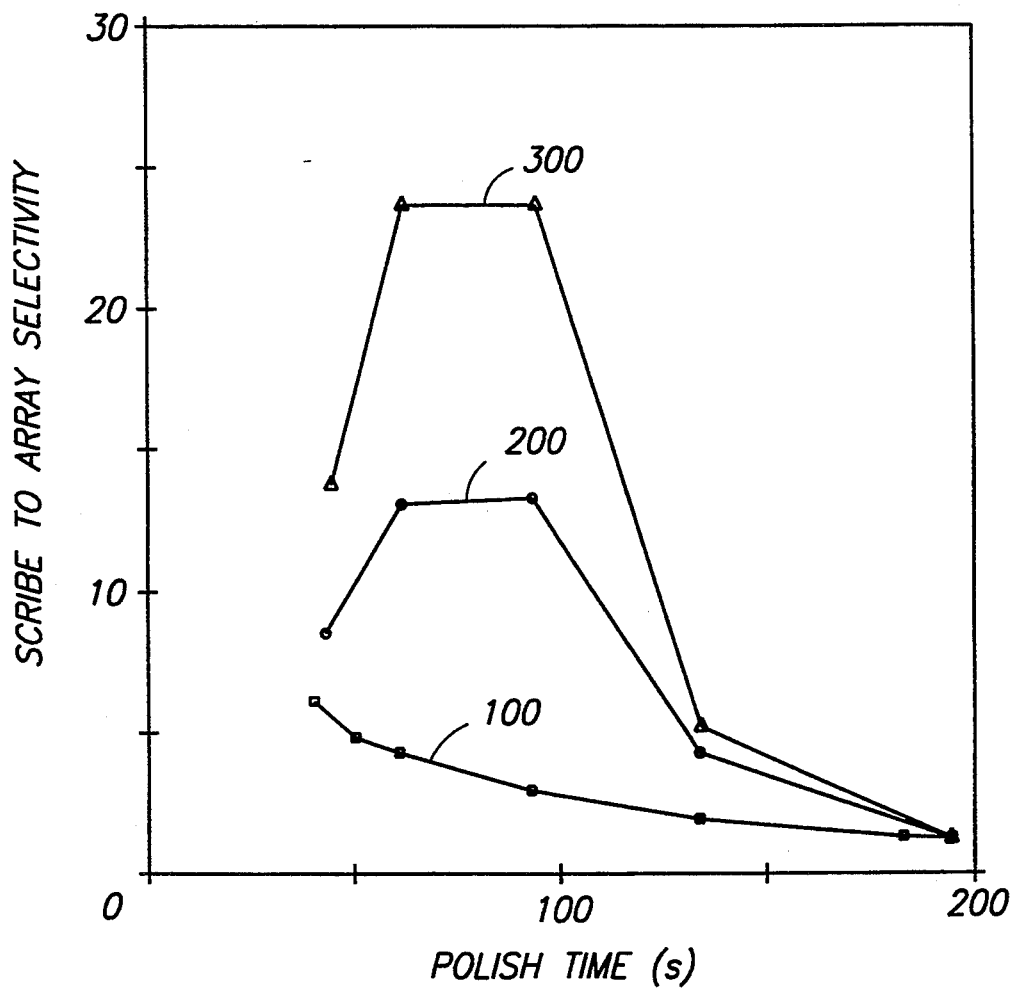
FIG. 7 is a graphical depiction comparing processes in accordance with the invention with prior art chemical-mechanical-polishing processes.

FIG. 7 compares the prior art chemical-mechanical polishing process with two of those in accordance with the invention. Line 100 represents the prior art chemical-mechanical polishing process depicted by FIG. 3, namely a BPSG layer of 2.6 microns thickness having no protective layer cap and utilizing the Cabot SC-1 slurry described above. Lines 200 and 300 represent CMP processes in accordance with the invention. All three sample wafers had a maximum separation distance between projections and indentations of 0.8 microns. The wafers represented by lines 200 and 300 each had a 2.6 microns thick deposited layer of BPSG, and a 1000 Angstroms and 200 Angstroms, respectively, thick deposited protective cap layer. The protective layer cap of line 200 was undoped $SiO_2$ deposited by decomposition of TEOS, while the protective layer cap of line 300 was $Si_3N_4$.

As is apparent, the prior art method starts out with a comparatively poor selectivity of the high projection points (array area) to the globally low points (scribe area), and such selectivity merely becomes progressively worse as chemical-mechanical polishing time continues. However with the method in accordance with the invention as depicted by lines 200 and 300, initial global high to global low selectivity is considerably higher and actually increases to a maximum upon initial exposure of the underlying conformal layer at the highest projections as represented by the flat areas. Then, selectivity decreases to a level to achieve desired planarity which everywhere remains above line 100 until all of the protective layer has been removed, evidenced by the last far-right data point of lines 200 and 300. Such far-right data point corresponds to complete removal of the protective layer, thus resulting in the equal selectivity produced by the last data point of line 100, but at a farther point in processing time.

Figure 8B:
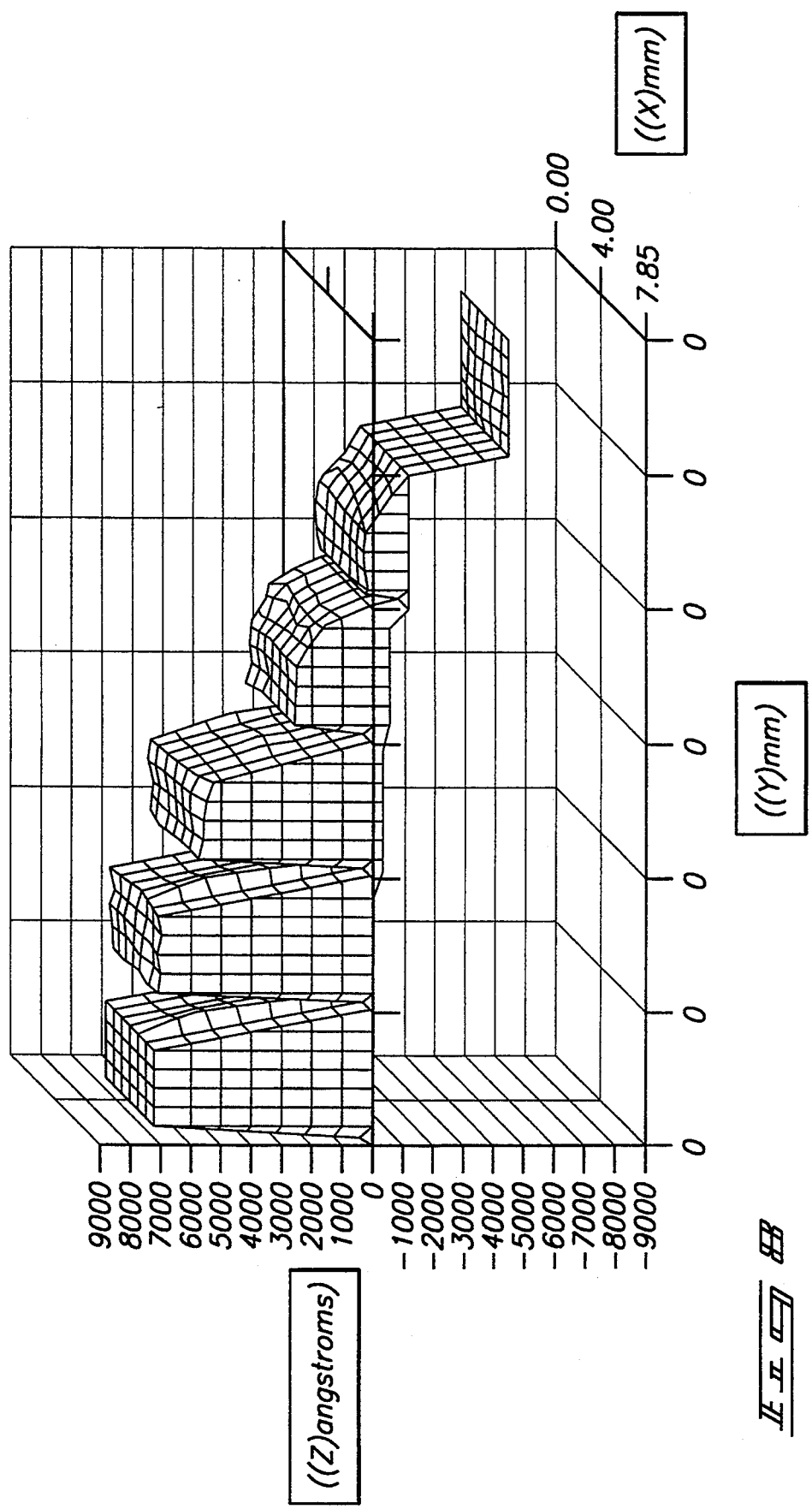
FIG. 8 is a graphical depiction of one chemical-mechanical polishing process conducted in accordance with the invention.
Figure 6:
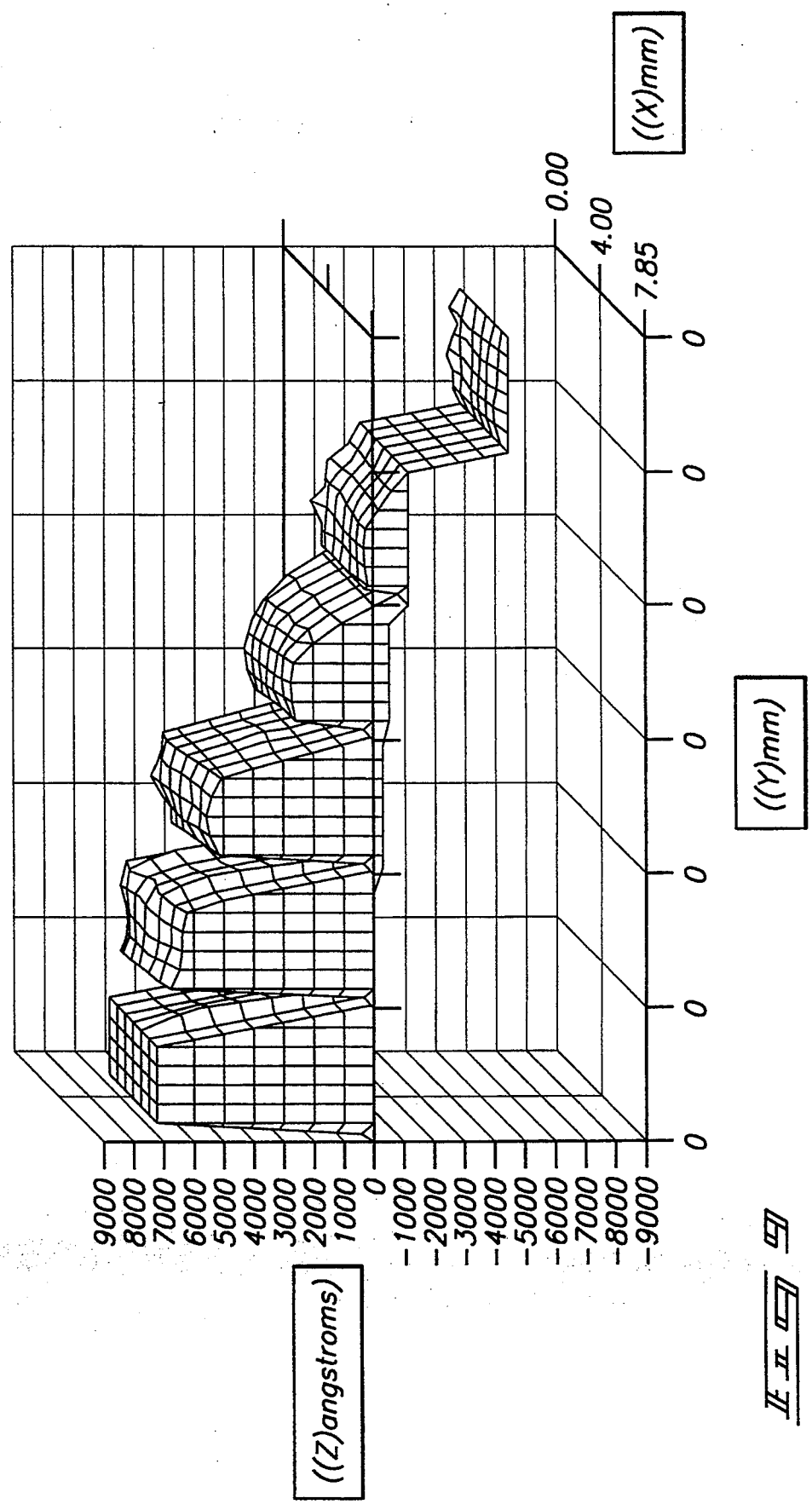

FIGS. 8 and 9 further illustrate inventive processes in comparison with the prior art representation of FIG. 3. FIG. 8 represents data reflective from the polishing of the line 200 wafer, while FIG. 9 is reflective of the line 300 wafer. Two noted observations will be apparent in comparison of each of these figures independently with FIG. 3. First, the finished position of the sixth, far-right data representation on each FIG. 8 and 9 graph is considerably closer to the zero "Z" plane than is the plane represented by the prior art FIG. 3 process. Further, it will be apparent that the two, three, four, and five data points from the left of each FIG. 8 and 9 graph do not project below the zero "Z" plane to near the degree that the same second through fifth data points do in FIG. 3.

In compliance with the statute, the invention has been described in language more or less specific as to methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of providing and planarizing an insulating layer on a semiconductor wafer comprising the following sequential steps:
    providing a conformal layer of insulating material to a first thickness over a semiconductor wafer having non-planar topography;
    providing a blanketing chemical-mechanical polishing protective layer over the conformal layer to a second thickness, the protective layer being of different composition than the conformal layer, the blanketing protective layer having an outermost surface; and
    chemical-mechanical polishing through the outermost surface of the blanketing protective layer and then through the conformal layer in a single chemical-mechanical polishing step using a single chemical-mechanical polishing slurry and under conditions which in combination with the slurry remove the conformal layer material at a faster rate than the protective layer material, and continuing chemical-mechanical polishing in the single step through the protective layer and the conformal layer until all protective layer material is removed, the protective layer upon outward exposure of conformal layer material in high topographical areas restricting material removal from low topographical areas during such chemical-mechanical polishing.

2. The semiconductor processing method of claim 1 wherein the first thickness is greater than the second thickness.

3. The semiconductor processing method of claim 1 wherein,
    the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface;
    the first thickness being selected such that the first thickness minus the third thickness is less than 1.5 times the greatest topographical distance.

4. The semiconductor processing method of claim 1 wherein,
    the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface;
    the first thickness being selected such that the first thickness minus the third thickness is less than or equal to 1.1 times the greatest topographical distance.

5. The semiconductor processing method of claim 1 wherein the conformal layer insulating material comprises boron and/or phosphorus doped $SiO_2$, and the protective layer comprises undoped $SiO_2$.

6. The semiconductor processing method of claim 1 wherein the conformal layer insulating material comprises boron and/or phosphorus doped $SiO_2$, and the protective layer comprises a nitride compound.

7. The semiconductor processing method of claim 1 wherein the conformal layer insulating material comprises boron and/or phosphorus doped $SiO_2$, and the protective layer comprises titanium metal.

8. The semiconductor processing method of claim 1 wherein the conformal layer insulating material comprises boron and/or phosphorus doped $SiO_2$, and the protective layer is selected from the group consisting of tungsten metal, tungsten nitride and polysilicon, or mixtures thereof.

9. The semiconductor processing method of claim 1 wherein,
    the conformal layer insulating material comprises boron and/or phosphorus doped $SiO_2$, and the protective layer comprises undoped $SiO_2$;
    the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and
    the first thickness being selected such that the first thickness minus the third thickness is less than 1.5 times the greatest topographical distance.

10. The semiconductor processing method of claim 1 wherein,
    the conformal layer insulating material comprises boron and/or phosphorus doped $SiO_2$, and the protective layer comprises a nitride compound;
    the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

11. The semiconductor processing method of claim 1 wherein, the conformal layer insulating material comprises boron and/or phosphorus doped $SiO_2$, and the protective layer comprises titanium metal;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

12. The semiconductor processing method of claim 1 wherein, the conformal layer insulating material comprises boron and/or phosphorus doped $SiO_2$, and the protective layer comprises tungsten metal;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

13. A semiconductor processing method of providing and planarizing an insulating layer on a semiconductor wafer comprising the following sequential steps:

providing a conformal layer of insulating material to a first thickness over a semiconductor wafer having non-planar topography;

providing a blanketing chemical-mechanical polishing protective layer over the conformal layer to a second thickness, the protective layer being of different composition than the conformal layer, the blanketing protective layer having an outermost surface; and chemical-mechanical polishing the protective layer and conformal layer in at least two chemical-mechanical polishing steps using first and second respective chemical-mechanical polishing slurries, the first chemical-mechanical polishing slurry and step being conducted through the outermost surface of the protective layer and removing outermost portions of the protective layer in a manner which is substantially selective to the underlying conformal layer to outwardly expose conformal layer material in high topographical areas by such first chemical mechanical polishing step, the second chemical-mechanical polishing step and slurry removing the conformal layer material at a faster rate than the protective layer material, and continuing the second step chemical-mechanical polishing .through the protective layer and the conformal layer until all protective layer material is removed, the protective layer upon outward exposure of conformal layer material in high topographical areas restricting material removal from low topographical areas during such second chemical-mechanical polishing step.

14. The semiconductor processing method of claim 13 wherein the first thickness is greater than the second thickness.

15. The semiconductor processing method of claim 13 wherein, the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface;

the first thickness being selected such that the first thickness minus the third thickness is less than 1.5 times the greatest topographical distance.

16. The semiconductor processing method of claim 13 wherein, the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface;

the first thickness being selected such that the first thickness minus the third thickness is less than 1.1 times the greatest topographical distance.

17. The semiconductor processing method of claim 13 wherein the conformal layer insulating material comprises boron and/or phosphorus doped $SiO_2$, and the protective layer comprises undoped $SiO_2$.

18. The semiconductor processing method of claim 13 wherein the conformal layer insulating material comprises boron and/or phosphorus doped $SiO_2$, and the protective layer comprises a nitride compound.

19. The semiconductor processing method of claim 13 wherein the conformal layer insulating material comprises boron and/or phosphorus doped $SiO_2$, and the protective layer comprises titanium metal.

20. The semiconductor processing method of claim 13 wherein the conformal layer insulating material comprises boron and/or phosphorus doped $SiO_2$, and the protective layer comprises tungsten metal.

21. The semiconductor processing method of claim 13 wherein, the conformal layer insulating material comprises boron and/or phosphorus doped $SiO_2$, and the protective layer comprises undoped $SiO_2$;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

22. The semiconductor processing method of claim 13 wherein, the conformal layer insulating material comprises boron and/or phosphorus doped $SiO_2$, and the protective layer comprises a nitride compound;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

23. The semiconductor processing method of claim 13 wherein, the conformal layer insulating material comprises boron and/or phosphorus doped $SiO_2$, and the protective layer comprises titanium metal;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest ,points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

24. The semiconductor processing method of claim 13 wherein, the conformal layer insulating material comprises boron and/or phosphorus doped $SiO_2$, and the protective layer comprises tungsten metal;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

25. A semiconductor processing method of providing and planarizing an insulating layer on a semiconductor wafer comprising the following sequential steps:

providing a conformal layer of insulating material to a first thickness over a semiconductor wafer having non-planar topography;

providing a blanketing chemical-mechanical polishing protective layer over the conformal layer to a second thickness, the protective layer being of different composition than the conformal layer, the blanketing protective layer having an outermost surface; and chemical-mechanical polishing the protective layer and conformal layer in at least three chemical-mechanical polishing steps using first and second respective chemical-mechanical polishing slurries, the first chemical-mechanical polishing slurry and step being conducted through the outermost surface of the protective layer and removing outermost portions of the protective layer in a manner which is substantially selective to the underlying conformal layer to outwardly expose conformal layer material in high topographical areas by such first chemical mechanical polishing step, the second chemical-mechanical polishing step and slurry removing the conformal layer material at a faster rate than the protective layer material, the protective layer upon outward exposure of conformal layer material in high topographical areas restricting material removal from low topographical areas during such second chemical-mechanical polishing step, the third chemical-mechanical polishing step using the first slurry and being conducted to remove any remaining protective layer material.

26. The semiconductor processing method of claim 25 wherein the first thickness is greater than the second thickness.

27. The semiconductor processing method of claim 25 wherein, the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface;

the first thickness being selected such that the first thickness minus the third thickness is less than 1.5 times the greatest topographical distance.

28. The semiconductor processing method of claim 25 wherein, the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface;

the first thickness being selected such that the first thickness minus the third thickness is less than 1.1 times the greatest topographical distance.

29. The semiconductor processing method of claim 25 wherein the conformal layer insulating material comprises boron and/or phosphorus doped $SiO_2$, and the protective layer comprises undoped $SiO_2$.

30. The semiconductor processing method of claim 25 wherein the conformal layer insulating material comprises boron and/or phosphorus doped $SiO_2$, and the protective layer comprises a nitride compound.

31. The semiconductor processing method of claim 25 wherein the conformal layer insulating material comprises boron and/or phosphorus doped $SiO_2$, and the protective layer comprises titanium metal.

32. The semiconductor processing method of claim 25 wherein the conformal layer insulating material comprises boron and/or phosphorus doped $SiO_2$, and the protective layer comprises tungsten metal.

33. The semiconductor processing method of claim 25 wherein, the conformal layer insulating material comprises boron and/or phosphorus doped $SiO_2$, and the protective layer comprises undoped $SiO_2$;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

34. The semiconductor processing method of claim 25 wherein, the conformal layer insulating material comprises boron and/or phosphorus doped $SiO_2$, and the protective layer comprises a nitride compound;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

35. The semiconductor processing method of claim 25 wherein, the conformal layer insulating material comprises boron and/or phosphorus doped $SiO_2$, and the protective layer comprises titanium metal;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

36. The semiconductor processing method of claim 25 wherein, the conformal layer insulating material comprises boron and/or phosphorus doped $SiO_2$, and the protective layer comprises tungsten metal;

the non-planar wafer topography has a highestmost projecting surface prior to the provision of the conformal layer, the conformal layer of insulating material has a greatest topographical distance immediately prior to the step of chemical-mechanical polishing, the greatest topographical distance being defined by the elevational difference between the highest and lowest points of the outermost surface of the conformal layer, and the post chemical-mechanical polished insulating layer has a third thickness over the highestmost projecting surface; and the first thickness being selected such that the first thickness minus the third thickness is less than 1.5 times the greatest topographical distance.

* * * * *